Feb. 18, 1969 E. A. ABBOTT, JR 3,428,832

ELECTRONIC SWITCHING CIRCUIT EMPLOYING INSULATED GATE FIELD EFFECT TRANSISTORS

Filed April 21, 1966

INVENTOR.
EDWARD A. ABBOTT, JR.,
BY
Paul M. Coble
ATTORNEY.

United States Patent Office 3,428,832

Patented Feb. 18, 1969

3,428,832

ELECTRONIC SWITCHING CIRCUIT EMPLOYING INSULATED GATE FIELD EFFECT TRANSISTORS

Edward A. Abbott, Jr., Los Angeles, Calif., assignor to Hughes Aircraft Company, Culver City, Calif., a corporation of California Filed Apr. 21, 1966, Ser. No. 544,225

U.S. Cl. 307—251 4 Claims

Int. Cl. H03k 17/60

ABSTRACT OF THE DISCLOSURE

The disclosed switching circuit includes first and second voltage level shifting insulated gate transistors each having its source-drain path and a load resistor coupled in series between a pair of power supply terminals. The source-drain path of a series switching insulated gate transistor is connected between input and output terminals for the circuit, while the source-drain path of a shunt switching and transient suppressing insulated gate transistor is connected between the output terminal and a series-shunt mode selection switch. The respective gate electrodes of the second level shifting and shunt switching transistors are connected to the drain electrode of the first level shifting transistor, while the gate electrode of the series switching transistor is connected to the drain electrode of the second level switching transistor. The voltage applied to the input terminal is passed to the output terminal only during the presence of a control voltage applied to the gate electrode of the first level shifting transistor.

Figure 1:
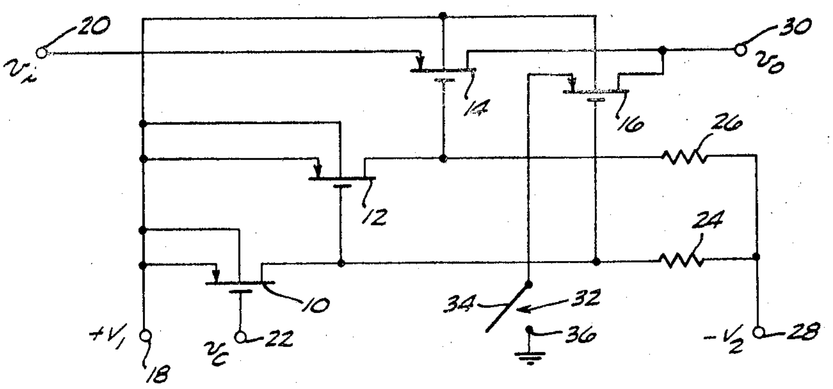

This invention relates to electronic switches, and more particularly relates to an electronic switching circuit employing a plurality of insulated gate transistors.

On account of their smaller size, lower power requirements and higher operating frequencies, electronic switches have replaced electromechanical switching devices such as relays in numerous electrical circuit applications. However, with the recent high interest in microminiaturized electronic circuitry, there has been a need for developing an electronic switch compatible with such miniaturized circuitry, not only from the standpoint of being able to fabricate a plurality of electronic switches on a common substrate, but also in being able to drive the switches with voltage levels provided by integrated circuit logic.

It is, therefore, an object of the present invention to provide an electronic switch which is more compatible with integrated electronic circuitry than electronic switches of the prior art.

It is a further object of the present invention to provide an electronic switching circuit which is readily convertible between a series operating mode and a series-shunt operating mode.

It is a still further object of the present invention to provide a reliable electronic switch of extremely small size and weight which is operable throughout a frequency range extending essentially from DC to 1 mc., and which is substantially unaffected by temperature changes over a range extending essentially from —55° C. to +125° C.

In accordance with the foregoing objects, the electronic switching circuit of the present invention includes an input terminal, an output terminal, a control terminal, a source of potential having first and second terminals, and four insulated gate transistors each having a gate electrode and a substrate region with a current path through a portion of the substrate region, the substrate region of each transistor being connected to the first terminal. A first resistance device and the current path of the first transistor are connected in series between the first and second terminals, while a second resistance device and the current path of the second transistor are also connected in series between the first and second terminals. The current path of the third transistor is connected between the input terminal and the output terminal, the current path of the fourth transistor also being connected to the output terminal. The gate electrode of the first transistor is connected to the control terminal, the gate electrode of each of the second and fourth transistors is connected to the current path of the first transistor, and the gate electrode of the third transistor is connected to the current path of the second transistor.

Additional objects, advantages and characteristic features of the present invention will become readily apparent from the following detailed description of a preferred embodiment of the invention when considered in conjunction with the accompanying drawing in which:

FIG. 1 is a schematic circuit diagram illustrating an electronic switch in accordance with the invention; and FIGS. 2(a)–(g) are timing waveforms illustrating signals at various points in the circuit of FIG. 1.

Referring with greater particularity to FIG. 1, an electronic switch according to the invention may be seen to include first and second voltage level shifting insulated gate transistors 10 and 12, respectively, a series switching insulated gate transistor 14, and a shunt switching and transient suppressing insulated gate transistor 16. As used herein, the term "insulated gate transistor" is intended to mean a transistor device having a current flow path through a portion of a substrate between a source electrode and a drain electrode and having a gate electrode electrically insulated from the substrate but capable of controlling the current flow between the source electrode and the drain electrode. An example of a specific insulated gate transistor which may be employed in the circuit of FIG. 1 is an FN1034 field effect transistor manufactured by Raytheon Company, Semiconductor Division, Mountain View, Calif., although it should be understood that any insulated gate transistor including but not being limited to metal oxide silicon field effect transistors (MOS FET) and thin film transistors are also suitable.

The substrate electrode of each of the insulated gate transistors 10, 12, 14 and 16 is connected to a terminal 18 supplying a potential of $+V_1$, which may be +6 volts, for example. The source electrodes of the respective level shifting transistors 10 and 12 are connected to the terminal 18, while the source electrode of the series switching transistor 14 is connected to a terminal 20 which receives an input voltage $v_i$. The input voltage $v_i$ may be a DC voltage or a slowly varying AC voltage relative to the switching control frequency and may vary between +6 and —6 volts, for example. A switching control, or drive, voltage $v_c$ is applied to a terminal 22 which is connected to the gate electrode of the first level shifting transistor 10. The control voltage $v_c$ may consist of a series of pulses having an amplitude of 6 volts and a pulse repetition frequency which may vary essentially from zero to 1 mc., for example.

The respective drain electrodes of the level shifting transistors 10 and 12 are connected via respective load resistor 24 and 26 to a terminal 28 supplying a potential of $-V_2$, such as —12 volts, for example. The drain electrode of the first level shifting transistor 10 is connected to the respective gate electrodes of the second level shifting transistor 12 and the shunt switching transistor 16, with the gate electrode of the series switching transistor 14 being connected to the drain electrode of the second level shifting transistor 12. The respective drain electrodes of the transistors 14 and 16 are connected to a terminal 30 which provides the output voltage $v_o$ from the circuit.

The source electrode of the transistor 16 is connected to a controllable connecting device 32, which for illustrative purposes is shown as a mechanical switch having a movable contact arm 34 connected to the source electrode of the transistor 16 and adapted to contact a terminal 36 which is connected to a level of reference potential designated as ground. The switch 30 facilitates ready conversion of the circuit between series and series-shunt modes of switching operation. Specifically, when the contact arm 34 does not contact the ground terminal 36, the series switching transistor 14 functions to selectively pass the input signal $v_i$ to the output terminal 30. On the other hand, when the contact arm 34 contacts the ground terminal, the shunt switching transistor 16 is operated 180° out of phase with respect to the series switching transistor 14 and functions to essentially ground the output terminal 30 when the series switching transistor 14 is in its non-conductive (signal blocking) condition.

Figure 2:
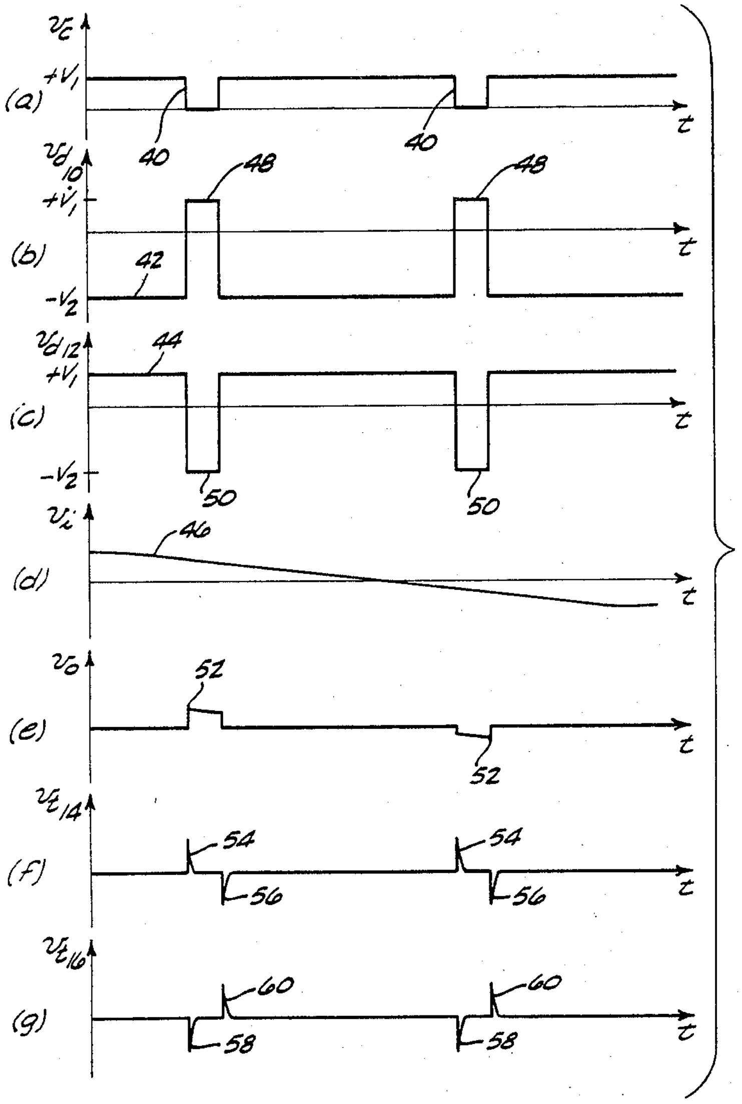

The operation of the switching circuit of FIG. 1 will now be described with reference to the timing waveforms of FIG. 2, first for the series mode of operation in which contact arm 34 of the switch 32 is maintained in the open position. As is shown in FIG. 2(a), a typical switching control voltage $v_c$ (which may be readily obtained from NPN type integrated circuit logic) normally resides at the level $+V_1$ except during the presence of switching pulses 40 when the level of the voltage $v_c$ becomes zero. As long as the control voltage resides at the level $+V_1$, the source and gate electrodes of transistor 10 are at essentially the same potential, and the transistor 10 is maintained non-conductive of current. The voltage $V_{d_{10}}$ at the drain electrode of the transistor 10 thus resides at a potential of essentially $-V_2$ as may be seen from the waveform 42 of FIG. 2(b). A positive source-to-gate bias is provided for the transistor 12, rendering the transistor 12 heavily conductive of current. Essentially no voltage drop appears across the transistor 12 so that the voltage $V_{d_{12}}$ at the drain electrode of the transistor 12 assumes a level of essentially $+V_1$ as shown by the waveform 44 of FIG. 2(c). For the aforementioned exemplary input voltage $v_i$ which does not exceed the voltage $V_1$ in magnitude, such a voltage $v_1$ being depicted by the waveform 46 of FIG. 2(d), in the absence of a control pulse 40 the voltage at the gate electrode of the transistor 14 will not be negative relative to the input voltage $v_i$. The transistor 14 is thus maintained non-conductive of current, and the input voltage $v_i$ is not passed to the output terminal 30.

When a control pulse such as shown at 40 in FIG. 2(a) is applied to the terminal 22, the transistor 10 is biased into a conductive condition, and its drain electrode is brought to a potential of essentially $+V_1$ as shown at 48 in FIG. 2(b). The transistor 12 is, in turn, biased to a nonconductive condition, and its drain electrode assumes a potential of essentially $-V_2$ as shown at 50 in FIG. 2(c). The resultant voltage applied to the gate electrode of the transistor 14 is sufficiently negative with respect to even the most negative level of the aforementioned exemplary input voltage $v_i$ so that the transistor 14 becomes conductive. Thus, the portion of the input voltage $v_i$ which is present during the duration of the pulse 40 is passed to the output terminal 30 where it appears as output pulse 52 of FIG. 2(e). Upon termination of the control pulse 40, the circuit returns to its aforedescribed initial condition and the output pulse 52 is terminated.

When it is desired to operate the circuit of FIG. 1 in a series-shunt mode, the switch 34 is closed in order to ground the source electrode of the transistor 16. The operation of the circuit is the same as that discussed above for series mode operation, except that when the transistor 14 is non-conductive the transistor 16 is conductive and effectively grounds the output terminal 30 through its source drain path and switch 34, and when the transistor 14 is conductive the transistor 16 is nonconductive, thereby substantially unaffecting the passage of input signals through the transistor 14.

As is shown in FIG. 2(f), on account of inherent gate-to-drain capacitance in transistor 14, spike-like transient pulses 54 and 56 are developed at the drain electrode of transistor 14 essentially coincident in time with the respective onset and termination of the control pulse 40. However, the inherent gate-to-drain capacitance of the transistor 16 is essentially the same as that of the transistor 14, and since the pulse 48 which drives the transistor 16 is 180° out of phase with respect to the pulse 50 which drives the transistor 14, spike-like transient pulses 58 and 60 of FIG. 2(g) which are essentially equal in magnitude and opposite in phase to the respective spike-like pulses 54 and 56 are developed at the drain electrode of transistor 16. Thus, the transient spike voltages developed by the transistor 14 are substantially cancelled by the transient spike voltages developed by the transistor 16, thereby resulting in an improved output waveform.

Although the invention has been shown and described with reference to a particular embodiment, nevertheless various changes and modifications obvious to a person skilled in the art to which the invention pertains are deemed to lie within the spirit, scope and contemplation of the invention as set forth in the appended claims.

What is claimed is:

1. An electronic switching circuit comprising: an input terminal; an output terminal; a control terminal; a source of potential having first, second, and third terminals; first, second, third, and fourth insulated gate transistors each having a gate electrode and a substrate region with a current path through a portion of said region; means for connecting the substrate region of each of said transistors with said first terminal; first and second resistance devices; said first resistance device and the current path of said first transistor being connected in series between said first and second terminals; said second resistance device and the current path of said second transistor being connected in series between said first and second terminals; the current path of said third transistor being connected between said input terminal and said output terminal; the current path of said fourth transistor being selectively connected between said output terminal and said third terminal; the gate electrode of said first transistor being connected to said control terminal; the gate electrode of each of said second and fourth transistors being connected to the current path of said first transistor; and the gate electrode of said third transistor being connected to the current path of said second transistor.

2. An electronic switching circuit comprising: an input terminal; an output terminal; a control terminal; a source of potential having first, second, and third terminals; first, second, third, and fourth insulated gate transistors each having a gate electrode and a substrate region with a current path through a portion of said region; means for connecting the substrate region of each of said transistors with said first terminal; first and second resistance devices; said first resistance device and the current path of said first transistor being connected in series between said first and second terminals; said second resistance device and the current path of said second transistor being connected in series between said first and second terminals; the current path of said third transistor being connected between said input terminal and said output terminal; a controllable connecting device, said controllable connecting device and the current path of said fourth transistor being connected in series between said output terminal and said third terminal the gate electrode of said first transistor being connected to said control terminal; the gate electrode of each of said second and fourth transistors being connected to the current path of said first transistor; and the gate electrode of said third transistor being conenected to the current path of said second transistor.

3. An electronic switching circuit comprising: a source of potential having first, second, and third terminals; first, second, third and fourth insulated gate transistors each having a source electrode, a drain electrode, a gate electrode, and a substrate electrode; means for connecting the substrate electrode of each of said transistors with said first terminal; the source electrode of each of said first and second transistors being connected to said first terminal; the source electrode of said fourth transistor being selectively connected to said third terminal; a first resistance device connected between the drain electrode of said first transistor and said second terminal; a second resistance device connected between the drain electrode of said second transistor and said second terminal; an input terminal connected to the source electrode of said third transistor; an output terminal connected to the drain electrode of each of said third and fourth transistors; a control terminal connected to the gate electrode of said first transistor; the gate electrode of each of said second and fourth transistors being connected to the drain electrode of said first transistor; and the gate electrode of said third transistor being connected to the drain electrode of said second transistor.

4. An electronic switching circuit comprising: a source of potential having first, second, and third terminals; first, second, third, and fourth insulated gate transistors each having a source electrode, a drain electrode, a gate electrode, and a substrate electrode; means for connecting the substrate electrode of each of said transistors with said first terminal; the source electrode of each of said first and second transistors being connected to said first terminal; a first resistance device connected between the drain electrode of said first transistor and said second terminal; a second resistance device connected between the drain electrode of said second transistor and said second terminal; an input terminal connected to the source electrode of said third transistor; an output terminal connected to the drain electrode of each of said third and fourth transistors; a control terminal connected to the gate electrode of said first transistor; controllable connection means for selectively connecting the source electrode of said fourth transistor with said third terminal; the gate electrode of each of said second and fourth transistors being connected to the drain electrode of said first transistor; and the gate electrode of said third transistor being connected to the drain electrode of said second transistor.

References Cited

UNITED STATES PATENTS 3,296,547 1/1967 Sickles ---------- 307—251 XR

ARTHUR GAUSS, *Primary Examiner.*

S. D. MILLER, *Assistant Examiner.*

U.S. Cl. X.R.

307—303, 304